(12) United States Patent
Beausoleil et al.

(10) Patent No.: US 7,047,179 B2
(45) Date of Patent: *May 16, 2006

(54) CLUSTERED PROCESSORS IN AN EMULATION ENGINE

(75) Inventors: William F. Beausoleil, Hopewell Junction, NY (US); Tak-kwong Ng, Hyde Park, NY (US); Helmut Roth, Hopewell Junction, NY (US); Peter Tannenbaum, Red Hook, NY (US); N. James Tomassetti, Kingston, NY (US)

(73) Assignee: Quickturn Design Systems, Inc., San Jose, CA (US)

( * ) Notice: Subject to any disclaimer, the term of this patent is extended or adjusted under 35 U.S.C. 154(b) by 235 days.

This patent is subject to a terminal disclaimer.

(21) Appl. No.: 10/459,340

(22) Filed: Jun. 11, 2003

(65) Prior Publication Data

US 2003/0212539 A1 Nov. 13, 2003

Related U.S. Application Data

(63) Continuation of application No. 09/373,125, filed on Aug. 12, 1999, now Pat. No. 6,618,698.

(51) Int. Cl.
*G06F 9/455* (2006.01)

(52) U.S. Cl. .............................. 703/23; 703/24; 703/25; 712/222

(58) Field of Classification Search ................ 703/23, 703/25, 28, 24; 709/238; 712/222
See application file for complete search history.

(56) References Cited

U.S. PATENT DOCUMENTS

| | | | |
|---|---|---|---|
| 3,775,598 A | 11/1973 | Chao et al. | 235/153 |
| 4,306,286 A | 12/1981 | Cocke et al. | 364/200 |
| 4,594,677 A | 6/1986 | Barlow | 364/578 |
| 4,656,580 A | 4/1987 | Hitchcock, Sr. et al. | 364/200 |
| 4,744,084 A | 5/1988 | Beck et al. | 371/23 |
| 4,754,398 A | 6/1988 | Pribnow | 709/226 |
| 4,769,817 A | 9/1988 | Krohn et al. | 371/23 |
| 4,775,950 A | 10/1988 | Terada et al. | 364/578 |
| 4,782,440 A | 11/1988 | Nomizu et al. | 364/200 |
| 4,819,150 A | 4/1989 | Jennings et al. | 364/200 |
| 4,862,347 A | 8/1989 | Rudy | 364/200 |
| 4,914,612 A | 4/1990 | Beece et al. | 364/578 |
| 4,918,594 A | 4/1990 | Onizuka | 364/200 |
| 5,132,971 A | 7/1992 | Oguma et al. | 714/28 |
| 5,146,460 A | 9/1992 | Ackerman et al. | 371/23 |
| 5,179,672 A | 1/1993 | Genduso et al. | 395/375 |
| 5,210,700 A | 5/1993 | Tom | 364/489 |
| 5,263,149 A | 11/1993 | Winlow | 395/500 |

(Continued)

OTHER PUBLICATIONS

"Local ratio cut and set covering partitioning for huge logic emulation systems", Chou et al□□Computer-Aided Design of Integrated Circuits and Systems, IEEE Transactions, vol. 14, Issue 9, □□Sep. 1995 pp.:1085-1092 □□.*

(Continued)

*Primary Examiner*—Fred Ferris
(74) *Attorney, Agent, or Firm*—Orrick Herrington & Sutcliffe LLP

(57) ABSTRACT

Clusters of processors are interconnected as an emulation engine such that processors share input and data stacks, and the setup and storing of results are done in parallel, but the output of one evaluation unit is connected to the input of the next evaluation unit. A set of 'cascade' connections provides access to the intermediate values. By tapping intermediate values from one processor, and feeding them to the next, a significant emulation speedup is achieved.

13 Claims, 5 Drawing Sheets

U.S. PATENT DOCUMENTS

| | | | | |
|---|---|---|---|---|
| 5,299,313 A | | 3/1994 | Petersen et al. | 395/200 |
| 5,313,618 A | * | 5/1994 | Pawloski | 703/28 |
| 5,327,361 A | | 7/1994 | Long et al. | 364/57 |
| 5,329,470 A | | 7/1994 | Sample et al. | 364/578 |
| 5,339,262 A | | 8/1994 | Rostoker et al. | 364/578 |
| 5,375,074 A | | 12/1994 | Greenberg et al. | 364/578 |
| 5,410,300 A | | 4/1995 | Gould et al. | 340/825.79 |
| 5,425,036 A | | 6/1995 | Liu et al. | 371/23 |
| 5,442,772 A | | 8/1995 | Childs et al. | 395/500 |
| 5,448,496 A | | 9/1995 | Butts et al. | 364/489 |
| 5,452,231 A | | 9/1995 | Butts et al. | 364/489 |
| 5,452,239 A | | 9/1995 | Dai et al. | 364/578 |
| 5,475,624 A | | 12/1995 | West | 364/578 |
| 5,477,475 A | | 12/1995 | Sample et al. | 364/578 |
| 5,490,266 A | | 2/1996 | Sturges | 395/500 |
| 5,537,341 A | | 7/1996 | Rose et al. | 364/579 |
| 5,548,785 A | | 8/1996 | Fogg, Jr. et al. | 395/841 |
| 5,551,013 A | * | 8/1996 | Beausoleil et al. | 703/23 |
| 5,566,097 A | | 10/1996 | Myers et al. | 364/578 |
| 5,581,562 A | | 12/1996 | Lin et al. | 371/22.1 |
| 5,583,450 A | | 12/1996 | Trimberger et al. | 326/41 |
| 5,590,345 A | | 12/1996 | Barker et al. | 712/11 |
| 5,590,372 A | | 12/1996 | Dieffenderfer et al. | 395/823 |
| 5,596,742 A | | 1/1997 | Agarwal et al. | 395/500 |
| 5,600,263 A | | 2/1997 | Trimberger et al. | 326/39 |
| 5,602,754 A | | 2/1997 | Beatty et al. | 364/489 |
| 5,612,891 A | | 3/1997 | Butts et al. | 364/489 |
| 5,615,127 A | | 3/1997 | Beatty et al. | 364/489 |
| 5,629,637 A | | 5/1997 | Trimberger et al. | 326/93 |
| 5,629,858 A | | 5/1997 | Kundu et al. | 364/488 |
| 5,634,003 A | | 5/1997 | Saitoh et al. | 395/200.1 |
| 5,644,515 A | | 7/1997 | Sample et al. | 364/578 |
| 5,646,545 A | | 7/1997 | Trimberger et al. | 326/38 |
| 5,696,987 A | | 12/1997 | DeLisle et al. | 395/800 |
| 5,699,283 A | | 12/1997 | Okazaki et al. | 364/578 |
| 5,701,441 A | | 12/1997 | Trimberger | 395/500 |
| 5,715,172 A | | 2/1998 | Tzeng | 364/490 |
| 5,715,433 A | | 2/1998 | Raghavan et al. | 395/500 |
| 5,721,695 A | | 2/1998 | McMinn et al. | 364/578 |
| 5,721,953 A | | 2/1998 | Fogg, Jr. et al. | 395/841 |
| 5,727,217 A | | 3/1998 | Young | 703/24 |
| 5,734,581 A | | 3/1998 | Butts et al. | 364/489 |
| 5,734,869 A | | 3/1998 | Chen | 395/500 |
| 5,737,578 A | | 4/1998 | Hennenhoefer et al. | 395/500 |
| 5,742,180 A | | 4/1998 | DeHon et al. | 326/40 |
| 5,754,871 A | | 5/1998 | Wilkinson et al. | 712/20 |
| 5,761,483 A | | 6/1998 | Trimberger | 395/500 |
| 5,761,484 A | | 6/1998 | Agarwal et al. | 395/500 |
| 5,784,313 A | | 7/1998 | Trimberger et al. | 365/182 |
| 5,790,479 A | | 8/1998 | Conn | 368/118 |
| 5,796,623 A | | 8/1998 | Butts et al. | 364/489 |
| 5,798,645 A | | 8/1998 | Zeiner et al. | 364/578 |
| 5,801,955 A | | 9/1998 | Burgun et al. | 364/489 |
| 5,802,348 A | | 9/1998 | Stewart et al. | 395/500 |
| 5,812,414 A | | 9/1998 | Butts et al. | 364/489 |
| 5,815,687 A | | 9/1998 | Masleid et al. | 395/500 |
| 5,819,065 A | | 10/1998 | Chilton et al. | 395/500 |
| 5,822,564 A | | 10/1998 | Chilton et al. | 395/500 |
| 5,822,570 A | | 10/1998 | Lacey | 395/500 |
| 5,825,662 A | | 10/1998 | Trimberger | 364/491 |
| 5,842,031 A | | 11/1998 | Barker et al. | 712/23 |
| 5,966,528 A | * | 10/1999 | Wilkinson et al. | 712/222 |
| 6,035,117 A | * | 3/2000 | Beausoleil et al. | 703/25 |
| 6,051,030 A | * | 4/2000 | Beausoleil et al. | 703/28 |
| 6,075,937 A | * | 6/2000 | Scalzi et al. | 703/23 |
| 6,192,072 B1 | * | 2/2001 | Azadet et al. | 375/233 |
| 6,370,585 B1 | * | 4/2002 | Hagersten et al. | 709/238 |
| 6,564,376 B1 | * | 5/2003 | Froehlich et al. | 717/170 |
| 6,618,698 B1 | * | 9/2003 | Beausoleil et al. | 703/23 |

OTHER PUBLICATIONS

"Parallel Logic Programming Systems", J. C. De Kergommeaux, ACM Computing Surveys, vol. 26, No. 3, Sep. 1994.*

Encyclopedia of Computer Science, A. Ralston, p. 1248, ISBN 0-88405-321-0, 1975.

Microsoft Press Computer Dictionary, p. 447, ISBN 1-57231-446-X, 1997.

Computer Systems Architecture, J. Baer, ISBN 0-914894-15-3, Computer Science Press, 1980.

Collins, L., "Way Ahead of the Pack," *Electronic Times*, Jan. 30, 1997, pp. 16-17.

* cited by examiner

CLUSTERED PROCESSORS IN AN EMULATION ENGINE

This application is a continuation of and claims the benefit of United States application Ser. No. 09/373,125, filed on Aug. 12, 1999 now U.S. Pat. No. 6,618,698.

FIELD OF THE INVENTION

This invention relates to processor-based emulation engines.

TRADEMARKS

IBM is a registered trademark of International Business Machines Corporation, Armonk, N.Y.

BACKGROUND

Hardware emulators are programmable devices used in the verification of logic designs. A common method of logic design verification is to use processors to emulate the design. These processor-based emulators sequentially evaluate combinatorial logic levels, starting at the inputs and proceeding to the outputs. Each pass through the entire set of logic levels is called a Target Cycle; the evaluation of each individual logic level is called an Emulation Step.

Speed is a major selling factor in the emulator market, and is a well known problem. The purpose of this invention is to significantly improve our emulator's speed.

Our invention is an improvement over that disclosed in U.S. Pat. No. 5,551,013, "Multiprocessor for Hardware Emulation," issued to Beausoleil, et al., where a software-driven multiprocessor emulation system with a plurality of emulation processors connected in parallel in a module has one or more modules of processors to make up an emulation system. Our current processor-based emulator consists of a large number of interconnected processors, each with an individual control store, as described in detail in the U.S. Pat. No. 5,551,013. It would be desirable to improve the speed of this emulator.

While not suitable for our purposes, but for completeness, we note that FPGA-based emulation systems exist that achieve high speeds for small models. However, FPGA-based emulators are inherently I/O bound, and therefore perform poorly with large models. In general, the problem of high-speed emulation of large models had not been solved.

SUMMARY OF THE INVENTION

We have increased the processor-based emulation speed by increasing the amount of work done during each emulation step. In the original emulator, an emulation step consisted of a setup phase, an evaluation phase, and a storage phase. With this invention, clusters of processors are interconnected such that the evaluation phases can be cascaded. All processors in a cluster perform the setup in parallel. This setup includes routing of the data through multiple evaluation units for the evaluation phase. (For most efficient operation, the input stack and data stack of each processor must be stored in shared memory within each cluster.) Then, all processors perform the storage phase, again in parallel. The net result is multiple cascaded evaluations performed in a single emulation step. A key feature of the invention is that every processor in a cluster can access the input and data stacks of every other processor in the cluster.

DETAILED DESCRIPTION OF THE INVENTION

Figure 1:
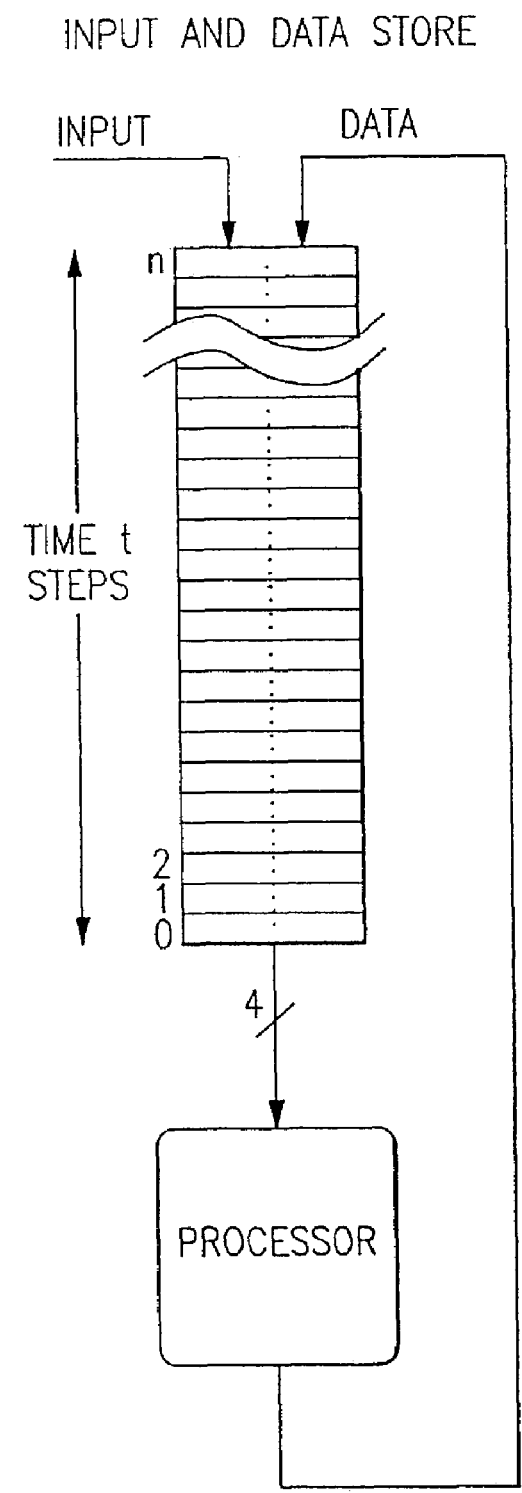
FIG. 1 illustrates how a processor reads a logic function and associated operands from the input and data store, performs the operation, and writes the results, all in a single step.

Before turning to the detailed description of our invention, we would note that one method of speedup is to evaluate independent logic paths in parallel. A parallel system may consist of hierarchically arranged processors: multiprocessor modules on multi-module boards, in a multi-board system. Synchronization is achieved by delaying the start of the next target cycle until the completion of all paths. This means that the effective emulation speed is determined by the time required to evaluate the longest path (called the critical path).

For evaluation of independent logic paths in parallel, we can describe our improvement over that disclosed in U.S. Pat. No. 5,551,013, "Multiprocessor for Hardware Emulation," issued to Beausoleil, et al. (fully incorporated herein by this reference) where a software-driven multiprocessor emulation system with a plurality of emulation processors connected in parallel in a module has one or more modules of processors to make up an emulation system. To illustrate, refer to FIG. 1 of U.S. Pat. No. 5,551,013, which shows an emulation chip, called a module here, having multiple (e.g. 64) processors. All processors within the module are identical and have the internal structure shown in FIG. 1. The sequencer and the interconnection network occurs only once in a module. The control stores hold a program created by an emulation compiler for a specified processor. The stacks hold data and inputs previously generated and are addressed by fields in a corresponding control word to locate the bits for input to the logic element. During each step of the sequencer an emulation processor emulates a logic function according to the emulation program. The data flow control interprets the current control word to route and latch data within the processor. The node-bit-out signal from a specified processor is presented to the interconnection network where it is distributed to each of the multiplexors (one for each processor) of the module. The node address field in the control word allows a specified processor to select for its node-bit-in signal the node-bit-out signal from any of the processors within its module. The node bit is stored in the input stack on every step. During any operation the node-bit-out signal of a specified processor may be accessed by none, one, or all of the processors within the module.

Data routing within each processor's data flow and through the interconnection network occurs independently of and overlaps the execution of the logic emulation function in each processor. Each control store stores control words executed sequentially under control of the sequencer and program steps in the associated module. Each revolution of the sequencer causes the step value to advance from zero to a predetermined maximum value and corresponds to one target clock cycle for the emulated design. A control word in the control store is simultaneously selected during each step of the sequencer. A logic function operation is defined by each control word. Thus, we have provided in FIG. 1 a software-driven multiprocessor emulation system which uses in a module a plurality of emulation processors. Each of these emulation processors has an execution unit for processing multiple types of logic gate functions. Each emulation processor switches from a specified one logic gate function to a next logic gate function in a switched-emulation sequence of different gate functions. The switched-emulation sequence of each of the processors thus can emulate a subset of gates in a hardware arrangement in which logic gates are of any type that the emulation processors functionally represent for a sequence of clock cycles. The processors are coupled by a like number of multiplexors having outputs respectively connected to the emulation processors of a module and having inputs respectively connected to each of the other emulation processors. The bus connected to the multiplexors enables an output from any emulation processor to be transferred to an input of any other of the emulation processors. In accordance with our improvement, it will be understood that we have provided clusters of processors which are interconnected as an emulation engine such that the setup and storing of results is done in parallel, but the output of one evaluation unit is made available as the input of the next evaluation unit. For this purpose we enabled processors to share input and data stacks, and have provided a set of 'cascade' connections which provides access to the intermediate values as we will describe. By tapping 'intermediate' values from one processor, and feeding them to the next, significant emulation speedup is achieved.

The embedded control store in each of the emulation processors stores logic-representing signals for controlling operations of the emulation processor. The emulation engine's processor evaluation unit illustrated by FIG. 1 is provided with an embedded data store for each of the emulation processors which receives data generated by the very same emulation processor under control of software signals stored in the embedded control store in the same emulation processor. It is the controls that are used to transmit data from any emulation processor through a connected multiplexor under control of software signals stored in the embedded control store to control computational emulation of the hardware arrangement by operation of the plurality of processors which form evaluation units of the emulation engine under software control in accordance with the following description of FIGS. 2, 3, 4, and 5.

An execution unit in each processor's emulation unit includes a table-lookup unit for emulating any type of logic gate function and a connection from the output of each processor to a multiplexor input with every other processor in a module. Each processor embeds a control store to store software logic-representing signals for controlling operations of each processor. Also in the prior system a data store is embedded in each processor to receive data generated under control of the software signals in the control store. The parallel processors on each module have a module input and a module output from each processor. The plurality of modules have their module outputs interconnected to module inputs of all other modules. A sequencer synchronously cycles the processors through mini-cycles on all modules. Logic software drives all of the processors in the emulation system to emulate a complex array of Boolean logic, which may represent all of the logic gates in a complex logic semiconductor chip or system. Each cycle of processing may control the emulation of a level of logic being verified by the single emulation processor illustrated in FIG. 1, having our 'cascade' connection control facility improvement.

Figure 2:
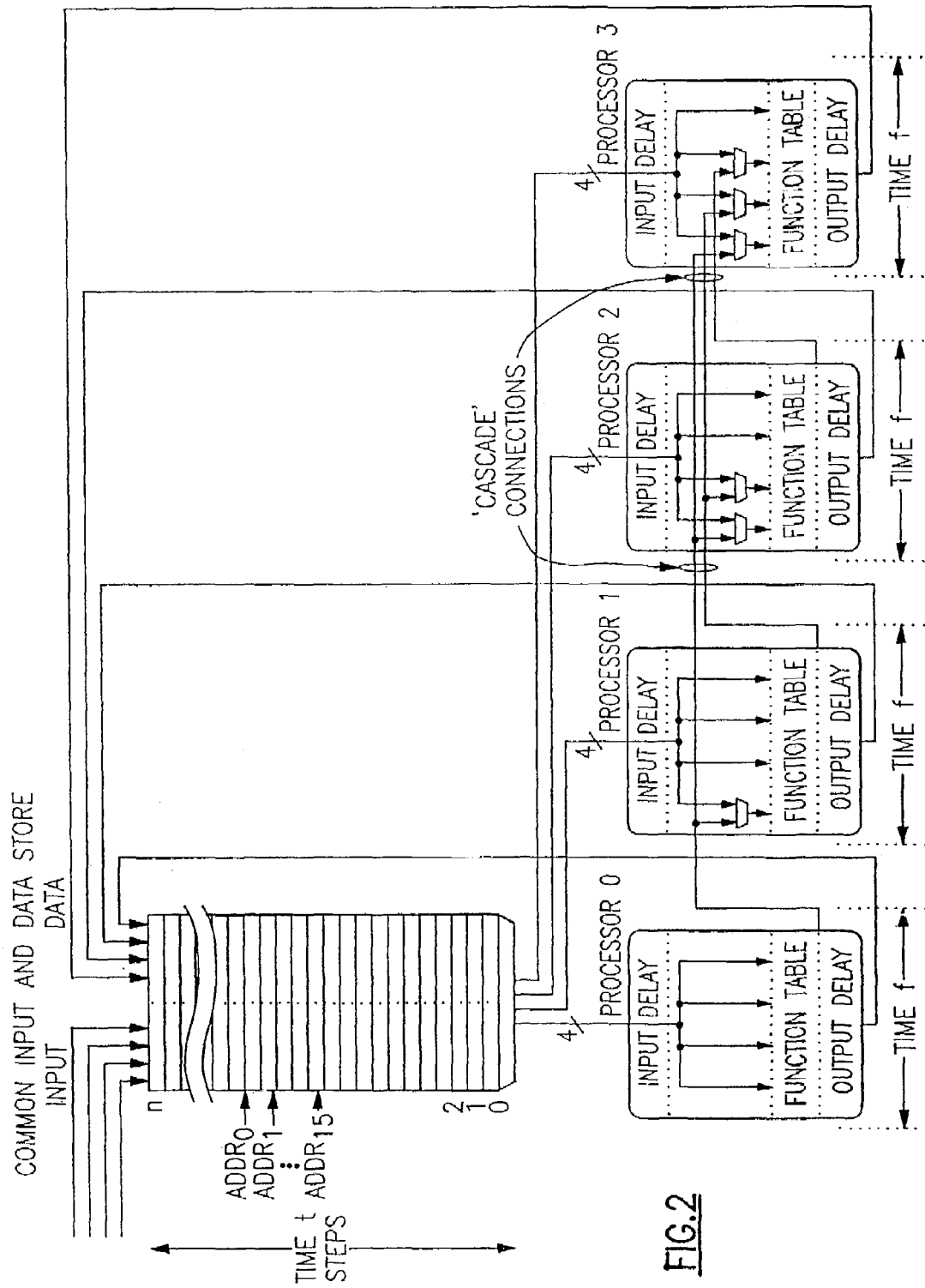
FIG. 2 illustrates how, in accordance with the invention, clusters of processors share input and data stacks and are interconnected such that the setup and storing of results is done in parallel, and an option is available to route the output of one evaluation unit, via 'cascade' connections, to the input of the next evaluation unit.

For a more detailed understanding of our invention, it should be understood that at each emulation step, a processor reads a logic function and associated operands from the data store, performs the operation, and writes the results as illustrated by FIG. 2 (consider the first stage as illustrative here). The internal clock frequency of the emulator is given as $(1/t)$, where t is the time taken for a single step. In general, if a processor is designated to evaluate the critical path with n logic levels, then the time taken will be $(n*t)$. (This assumes that the evaluation of the logic levels is not delayed by the availability of the input signals. Sharing input and data stacks within the clusters greatly enhances the probability that signals are available when needed.) The effective speed of the emulator, measured in cycles per unit time, is given as $1/(n*t)$. As our goal is to make the emulator run as fast as possible, we have developed the system as illustrated, where when, as stated above, t represents the time taken for a single emulation step, our invention enables, with the ability to evaluate four logic functions in the same time t, a 400% speedup by enabling each processor to evaluate effectively in parallel four (four stages are shown in FIG. 2) logic functions in this same time t.

Before we developed our current emulator, the clock granularity was the time for one processor to evaluate one logic function. We have found that signal propagation times and power consumption considerations determine the step time t. This time t is greater-than or equal-to $D1+D2+D3+D4$.

This sum, $D1+D2+D3+D4$, includes reading from the data store, setting up the operation, performing the evaluation, and storing the results. Note that setup can include gathering data from other processors on the same module or on other modules. We determined that for our planned interconnection networks, the setup times dominate the sum; there is a large differential between the amount of time spent during setup versus the amount of time spent during the logic evaluation.

We have provided, in accordance with our invention, the ability to exploit this time differential by tapping the results from one processor and feeding them to the next, within the step time t. Thus, when clusters of processors are interconnected such that the setup and storing of results is done in parallel, as illustrated by FIG. 2, the output of one evaluation unit has the option of being connected to the input of the next evaluation units. We have, in accordance with our invention, a set of 'cascade' connections which provides access to these intermediate values.

Figure 3:
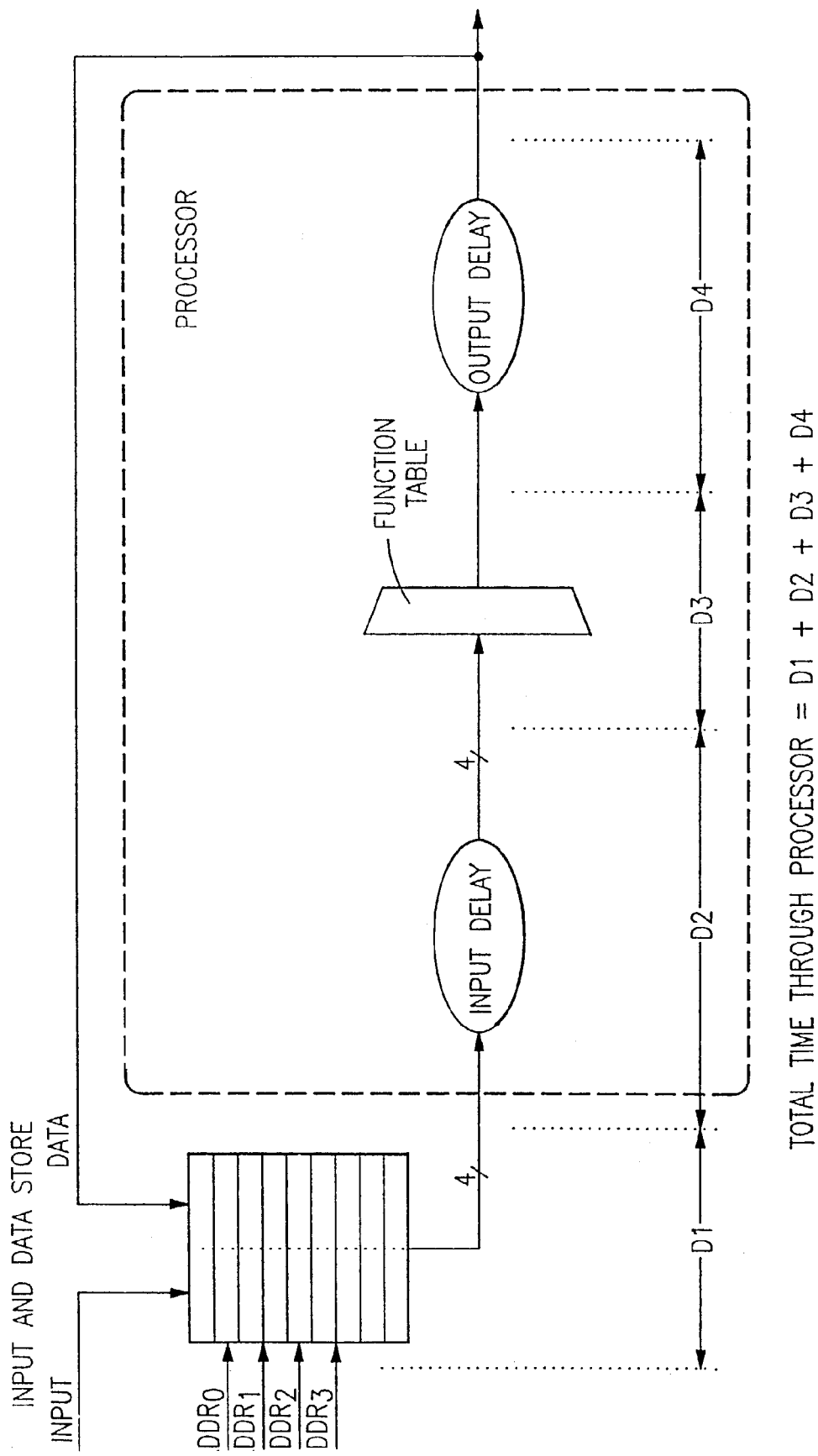
FIG. 3 illustrates a single processor, with times listed as D1 through D4, showing how the total step time is equal to the sum D1+D2+D3+D4.
Figure 4:
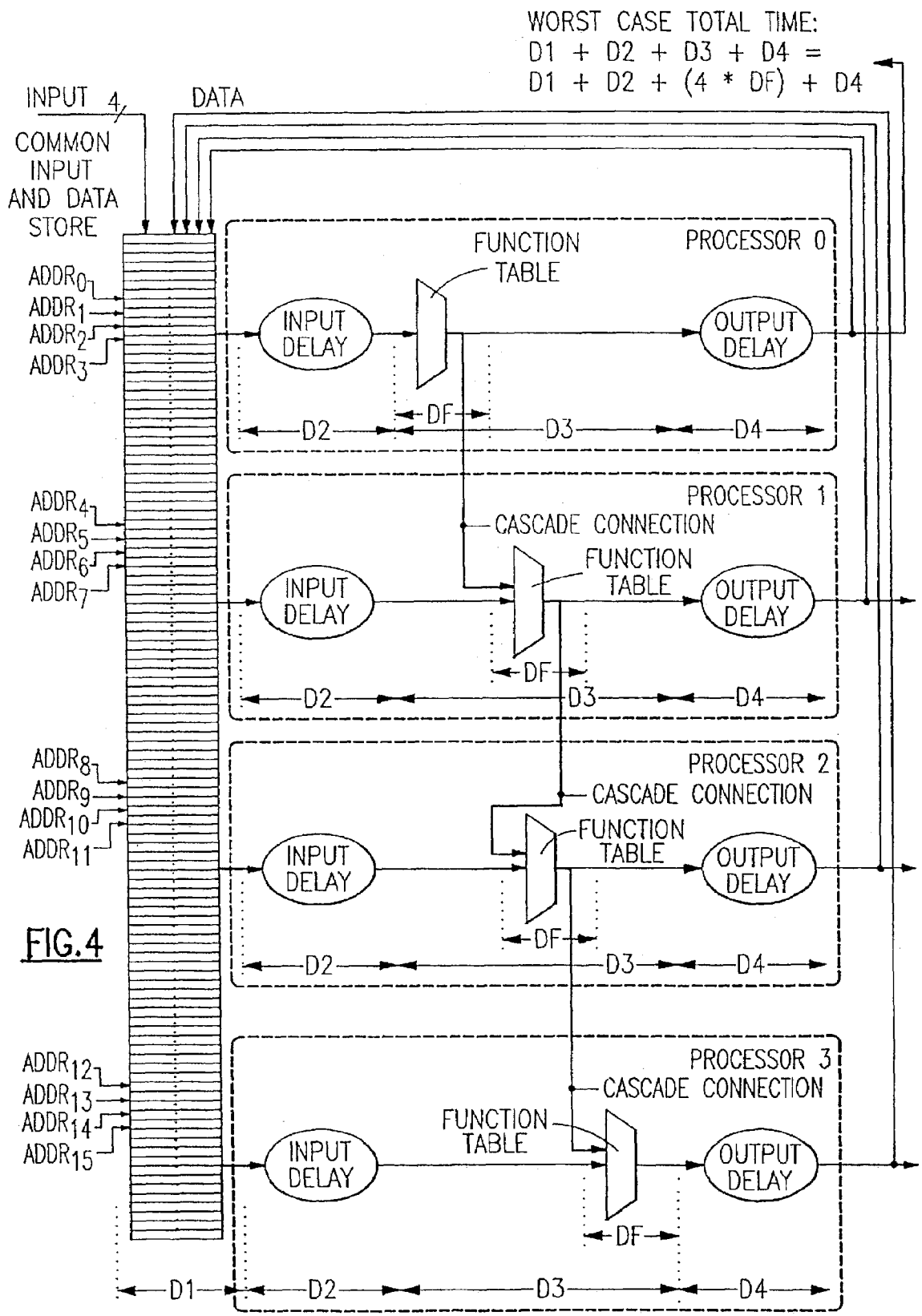
FIG. 4 shows four clustered processors and their shared input and data stacks, with the signal 'cascading' through the four function evaluation units, and with the total step time equal to the same sum D1+D2+D3+D4.

FIG. 3 shows a single processor, with the times listed as D1 through D4; the relative times are not drawn to scale. The total step time t is equal to the sum $D1+D2+D3+D4$. Now when we illustrate our invention in accordance with FIG. 4 with four clustered processors arranged with the signal flowing through all four function evaluation units, here again, the total step time is $D1+D2+D3+D4$. Note that the number of evaluations that can be performed within a step is limited by the relative times of DF and D3. The connections between the processors in FIG. 4 are through the cascade connections shown in FIG. 2. To visualize the speedup achieved through this invention, consider a logic path with 18 levels, A through R. In our current emulator, each evaluation would take a single step, for a total time of 18 steps. With this invention, levels A through D would be distributed among the four processors in a cluster for evaluation in the first step. E through H would be distributed to the same four processors for evaluation in the second step. I through L would be evaluated in the third step, M through P in the fourth step, and Q and R in the fifth step. The evaluation of the entire path would be reduced from 18 to 5 steps.

Figure 5:
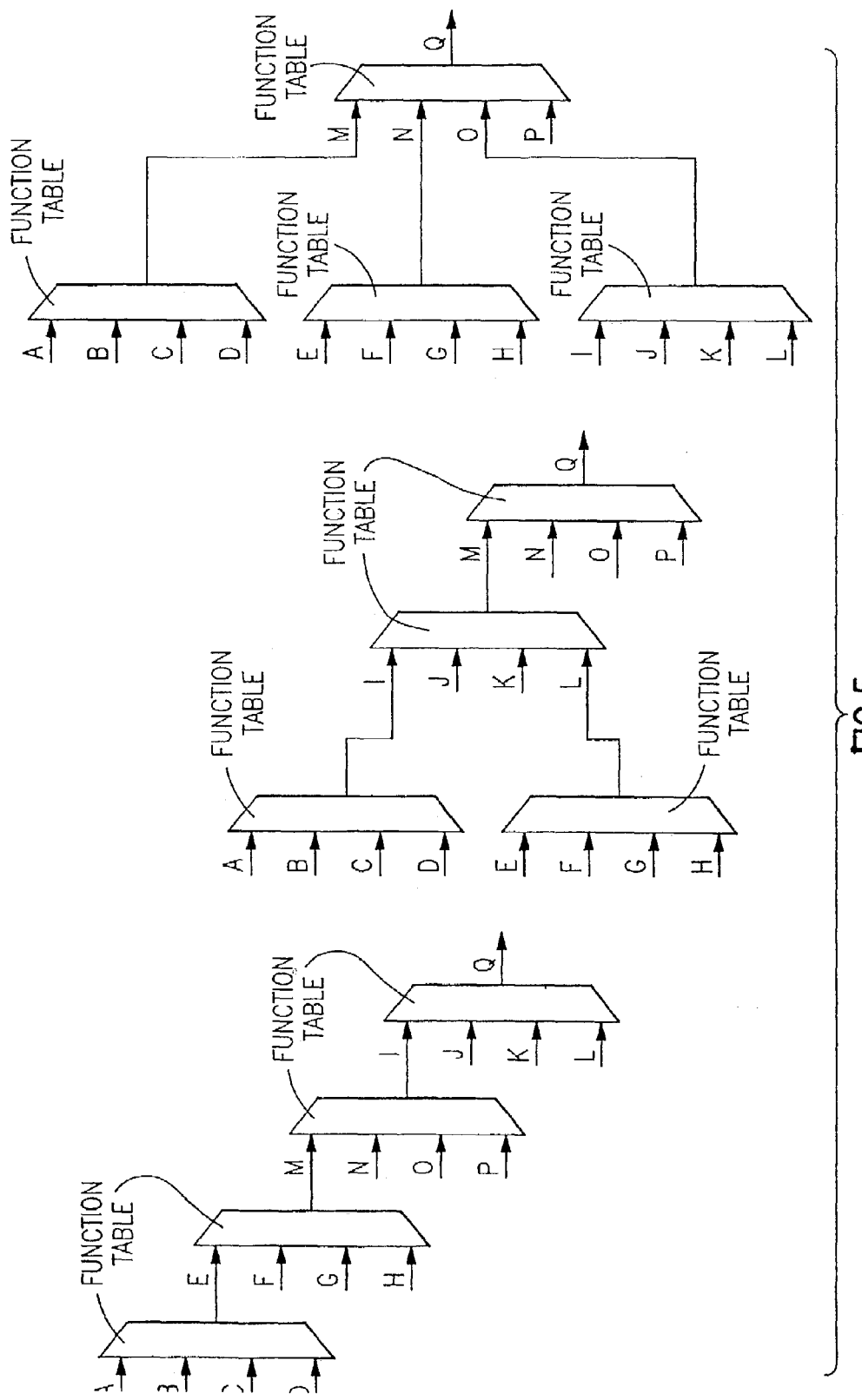
FIG. 5 illustrates three methods of routing thirteen signals through four function evaluation units, with the total step time in each case equal to the same sum D1+D2+D3+D4.

Illustrating how different connections can be made for differing numbers of processors, FIG. 5 illustrates three methods of routing thirteen signals through four function evaluation units, with the total step time in each case equal to the same sum D1+D2+D3+D4.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. On an integrated circuit, a processing system cluster for use in a processor-based system, comprising:
    a cascade connection that interconnects a plurality of processing systems within the processing system cluster, each of said processing systems having an output terminal coupled with an input terminal of at least one successive processing system in said cascade connection; and
    a stack system coupled with and shared with said processing systems within the processing system cluster, said stack system being configured to provide input signals to at least one of said processing systems and to receive output signals from at least one of said processing systems,
    wherein said cascade connection of said processing systems is configured to allow said processing systems to evaluate a plurality of logic functions at substantially the same time.

2. The processing system cluster of claim 1, wherein each of said processing systems in said cascade connection comprises an execution unit that is configured to process multiple types of logic functions.

3. The processing system cluster of claim 1, wherein said output terminal of each of said processing systems is coupled with said input terminals of substantially all successive processing systems in said cascade connection.

4. The processing system cluster of claim 1, wherein said output terminal of each of said processing systems is coupled with said input terminal of said at least one successive processing system via an interconnection network.

5. The processing system cluster of claim 1, wherein said stack system is configured to provide said input signals to each of said processing systems.

6. The processing system cluster of claim 1, wherein said cascade connection of said processing systems is configured to evaluate said plurality of logic functions sequentially.

7. The processing system cluster of claim 1, wherein said cascade connection of said processing systems is configured to receive a predetermined logic function and at least one associated operand from said stack system, to perform said predetermined logic function on said at least one associated operand, and to provide a result of said predetermined logic function to said stack system during each processing cycle of said cascade connection.

8. The processing system cluster of claim 7, wherein at least one of said processing systems in said cascade connection is configured to receive an intermediate result from at least one preceding processing system in said cascade connection, to perform said predetermined logic function on said at least one associated operand and said intermediate result, and to provide said result of said predetermined logic function to at least one succeeding processing system in said cascade connection.

9. On an integrated circuit, a processor-based system, comprising:
    a plurality of processing system clusters, each processing system cluster including a cascade connection that interconnects processing systems within each of the plurality of processing system clusters, each of processing systems capable of evaluating a plurality of logic functions at substantially the same time, the cascade connection comprising output terminals on each of said processing systems within each of said plurality of processing system clusters coupled with an input terminal of at least one successive processing system in a same one of said plurality of processing system clusters; and
    an interconnect network that interconnects each of the plurality of processing system clusters; and
    a stack system for each processing system cluster, said stack system coupled with and shared with each of said plurality of processing systems within each of said processing system clusters and being configured to provide input signals to at least one of said cascade connections of processing systems and to receive output signals from at least one of said cascade connections of processing systems.

10. The processor-based system of claim 9, further comprising a plurality of stack systems each being coupled with a corresponding one of said plurality of processing system clusters and being configured to provide input signals to at least one of said processing systems of said corresponding one of said plurality of processing system clusters and to receive output signals from at least one of said processing systems of said corresponding one of said plurality of processing system clusters.

11. The processing system cluster of claim 10, wherein at least one of said plurality of stack systems is configured to provide said input signals to each of said processing systems of said corresponding one of said plurality of processing system clusters.

12. The processing system cluster of claim 10, wherein each of said plurality of stack systems is configured to provide said input signals to each of said processing systems of said corresponding one of said plurality of processing system clusters.

13. The processor-based system of claim 9, wherein at least one of said plurality of stack systems is configured to provide input signals to each of said processing systems of said corresponding one of said plurality of processing system clusters and to receive output signals from at least one of said processing systems of said corresponding one of said plurality of processing system clusters.

* * * * *